US010026358B2

United States Patent
He et al.

(10) Patent No.: US 10,026,358 B2
(45) Date of Patent: Jul. 17, 2018

(54) PIXEL DRIVING CHIP, DRIVING METHOD THEREOF, AND PIXEL STRUCTURE

(71) Applicants: BOE TECHNOLOGY GROUP CO., LTD., Beijing (CN); Chengdu BOE Optoelectronics Technology Co., Ltd., Chengdu (CN)

(72) Inventors: Xiaoxiang He, Beijing (CN); Dongmei Wei, Beijing (CN); Xiaojing Qi, Beijing (CN)

(73) Assignees: BOE TECHNOLOGY GROUP CO., LTD., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 0 days.

(21) Appl. No.: 15/526,881

(22) PCT Filed: Oct. 31, 2016

(86) PCT No.: PCT/CN2016/104022
§ 371 (c)(1),
(2) Date: May 15, 2017

(87) PCT Pub. No.: WO2017/133280
PCT Pub. Date: Aug. 10, 2017

(65) Prior Publication Data
US 2018/0061312 A1 Mar. 1, 2018

(30) Foreign Application Priority Data
Feb. 2, 2016 (CN) .......................... 2016 1 0073383

(51) Int. Cl.
*G09G 3/36* (2006.01)
*G09G 3/325* (2016.01)
(Continued)

(52) U.S. Cl.
CPC ........... *G09G 3/325* (2013.01); *G09G 3/3291* (2013.01); *H01L 27/3248* (2013.01);
(Continued)

(58) Field of Classification Search
CPC .. G09G 3/30; G09G 3/36; G09G 5/00; G09G 5/10; G06F 3/038; G06F 3/044;
(Continued)

(56) References Cited

U.S. PATENT DOCUMENTS

2004/0174354 A1* 9/2004 Ono ..................... G09G 3/3233
345/204
2008/0036703 A1* 2/2008 Wang ..................... G09G 3/006
345/76
(Continued)

FOREIGN PATENT DOCUMENTS

CN 104680976 A 6/2005
CN 1989539 A 6/2007
(Continued)

OTHER PUBLICATIONS

International Search Report & Written Opinion dated Jan. 24, 2017 regarding PCT/CN2016/104022.
(Continued)

*Primary Examiner* — Pegeman Karimi
(74) *Attorney, Agent, or Firm* — Intellectual Valley Law, P.C.

(57) ABSTRACT

The present application discloses a pixel driving chip for compensating an original signal provided to a pixel structure including a driving transistor having a drain electrode coupled to a light-emitting device, the pixel driving chip includes a control circuit configured to generate at least one control voltage signals for controlling the driving transistor; an acquisition circuit configured to acquire a measured source voltage at a source electrode of the driving transistor
(Continued)

under control of the at least one control voltage signals; a computation circuit configured to compute a compensation voltage based on the measured source voltage; a storage circuit configured to store the compensation voltage; a compensation circuit configured to compensate the original signal provided to the driving transistor using the compensation voltage stored in the storage circuit to obtain a compensated signal; and an output circuit configured to output the compensated signal to the driving transistor.

20 Claims, 11 Drawing Sheets

(51) Int. Cl.
*G09G 3/3291* (2016.01)
*H01L 27/32* (2006.01)

(52) U.S. Cl.
CPC ... *H01L 27/3255* (2013.01); *G09G 2300/043* (2013.01); *G09G 2310/0245* (2013.01)

(58) Field of Classification Search
CPC .. G06F 3/04; G06F 3/041; G06K 9/00; G01R 27/26; G01D 5/24
See application file for complete search history.

(56) References Cited

U.S. PATENT DOCUMENTS

| | | | |
|---|---|---|---|
| 2008/0204483 A1* | 8/2008 | Abe | G09G 3/22 345/690 |
| 2010/0079423 A1* | 4/2010 | Takei | G09G 3/30 345/205 |
| 2015/0054862 A1 | 2/2015 | Kaplan et al. | |
| 2015/0302801 A1 | 10/2015 | Tan et al. | |
| 2016/0260377 A1 | 9/2016 | Hu | |
| 2016/0358546 A1 | 12/2016 | Ma | |
| 2017/0337669 A1* | 11/2017 | Kawai | G06T 5/009 |

FOREIGN PATENT DOCUMENTS

| | | |
|---|---|---|
| CN | 101123066 A | 2/2008 |
| CN | 101976546 A | 2/2011 |
| CN | 103093724 A | 5/2013 |
| CN | 103354078 A | 10/2013 |
| CN | 104269133 A | 1/2015 |
| JP | 2004280059 A | 10/2004 |
| TW | 201521001 A | 6/2015 |

OTHER PUBLICATIONS

First Office Action in the Chinese Patent Application No. 201610073383.4, dated Jul. 24, 2017; English translation attached.

* cited by examiner

PIXEL DRIVING CHIP, DRIVING METHOD THEREOF, AND PIXEL STRUCTURE

CROSS-REFERENCE TO RELATED APPLICATION

This application is a national stage application under 35 U.S.C. § 371 of International Application No. PCT/CN2016/104022, filed Oct. 31, 2016, which claims priority to Chinese Patent Application No. 201610073383.4, filed Feb. 2, 2016, the contents of which are incorporated by reference in the entirety.

TECHNICAL FIELD

The present invention relates to a pixel driving technique, more particularly to a pixel driving chip, a driving method thereof, and a pixel structure.

BACKGROUND

Organic Light Emitting Display (OLED) apparatuses are self-emitting apparatuses having many advantageous features including a low driving voltage, a high light emission efficiency, a short response time, high clarity and high contrast in displayed image, near-180° viewing angle, and a wide range of operational temperatures. OLED apparatuses may be divided into two categories, a passive matrix type OLED and an active matrix type OLED (AMOLED).

SUMMARY

In one aspect, the present invention provides a pixel driving chip for compensating an original signal provided to a pixel structure including a driving transistor having a drain electrode coupled to a light-emitting device, the pixel driving chip comprising a control circuit configured to generate at least one control voltage signals for controlling the driving transistor; an acquisition circuit configured to acquire a measured source voltage at a source electrode of the driving transistor under control of the at least one control voltage signals; a computation circuit configured to compute a compensation voltage based on the measured source voltage; a storage circuit configured to store the compensation voltage; a compensation circuit configured to compensate the original signal provided to the driving transistor using the compensation voltage stored in the storage circuit to obtain a compensated signal; and an output circuit configured to output the compensated signal to the driving transistor for driving the light-emitting device.

Optionally, the original signal is one of a gate scanning signal provided to a gate electrode of the driving transistor and a data signal provided to the source electrode of the driving transistor.

Optionally, the pixel driving chip further comprises a trigger circuit configured to trigger operations of the acquisition circuit, the computation circuit, and the storage circuit during powering up of the pixel structure for image display; and a shutdown circuit configured to shut down the acquisition circuit, the computation circuit, and the storage circuit after the compensation voltage is computed and stored.

Optionally, the compensated signal is a compensated gate scanning signal, and the output circuit is configured to output the compensated gate scanning signal to a gate electrode of the driving transistor for image display; and the compensation voltage is a threshold voltage of the driving transistor, wherein the at least one control voltage signals comprises a first test signal V1 outputted to a gate electrode of the driving transistor to control the driving transistor to be in the conducting state and a second test signal V2 outputted to a drain electrode of the driving transistor to control the driving transistor, the threshold voltage being a difference between the measured source voltage and the first test signal V1.

Optionally, the control circuit is configured to generate the at least one control voltage signals multiple times, each time the at least one control voltage signals comprises a set of first test signal V1 and second test signal V2, thereby generating a plurality sets of first test signal V1 and second test signal V2 having different voltage values; the storage circuit is configured to store a threshold voltage corresponding to each set of the plurality sets of control voltage signals; and the compensation circuit is configured to determine a matched set out of the plurality sets of first test signal V1 and second test signal V2 that matches with the original signal, and is configured to compensate the original signal using the threshold voltage corresponding to the matched set to obtain the compensated signal.

Optionally, the second test signal V2 of the matched set is one that is closest to a calculated drain voltage corresponding to the original signal, among a plurality of second test signals V2 of the plurality sets of first test signal V1 and second test signal V2.

Optionally, the compensated signal is a compensated data signal, and the output circuit is configured to output the compensated data signal to the source electrode of the driving transistor for image display; and the compensation voltage is a voltage drop at the source electrode of the driving transistor relative to a reference voltage Vdd, wherein the at least one control voltage signals comprises a third test signal V3 outputted to a gate electrode of the driving transistor to control the driving transistor to be in a blocking state and the reference voltage Vdd applied to the source of the driving transistor, the voltage drop being a difference between the measured source voltage of the driving transistor and a reference source voltage value.

Optionally, the reference source voltage value is one of a maximum value and a minimum value among all measured source voltages of all driving transistors in all pixel structures.

Optionally, the driving transistor is a P-type transistor and the third test signal V3 is multiplexed as the reference voltage Vdd.

Optionally, the at least one control voltage signals further comprise a fourth test signal V4 applied to the drain electrode of the driving transistor for discharging cathode voltage of the light-emitting device.

In another aspect, the present invention provides a method of driving a pixel structure including a driving transistor having a drain electrode coupled to a light-emitting device, comprising generating at least one control voltage signals to control the driving transistor; acquiring a measured source voltage at a source electrode of the driving transistor under control of the at least one control voltage signals; computing a compensation voltage based on the measured source voltage; storing the compensation voltage; compensating an original signal provided to the driving transistor using the compensation voltage to obtain a compensated signal; and outputting the compensated signal to the driving transistor.

Optionally, the original signal comprises one or both of a gate scanning signal provided to a gate electrode of the driving transistor and a data signal provided to the source electrode of the driving transistor.

Optionally, the method further comprises triggering processes of acquiring the measured source voltage, computing the compensation voltage based on the measured source voltage, and storing the compensation voltage during powering up of the pixel structure for image display; and ending the processes of acquiring the measured source voltage, computing the compensation voltage based on the measured source voltage, and storing the compensation voltage after the compensation voltage is computed and stored.

Optionally, the compensated signal is a compensated gate scanning signal, and the output circuit is configured to output the compensated gate scanning signal to a gate electrode of the driving transistor for image display; and the compensation voltage is a threshold voltage of the driving transistor, wherein the at least one control voltage signals comprises a first test signal V1 outputted to a gate of the driving transistor to control the driving transistor to be in the conducting state and a second test signal V2 outputted to a drain electrode of the driving transistor to control the driving transistor, the threshold voltage being a difference between the measured source voltage and the first test signal V1.

Optionally, generating the at least one control voltage signals comprises generating the at least one control voltage signals multiple times, each time the at least one control voltage signals comprises a set of first test signal V1 and second test signal V2, thereby generating a plurality sets of first test signal V1 and second test signal V2 having different voltage values; storing the compensation voltage comprises storing a threshold voltage value corresponding to each control voltage signal; and compensating the original signal comprises determining a matched set out of the plurality sets of first test signal V1 and second test signal V2 that matches with the original signal; and using the threshold voltage corresponding to the matched set to compensate the original signal to obtain the compensated signal.

Optionally, the second test signal V2 of the matched set is one that is closest to a calculated drain voltage corresponding to the original signal, among a plurality of second test signals V2 of the plurality sets of the first test signal V1 and the second test signal V2.

Optionally, the compensated signal is a compensated data signal, and the output circuit is configured to output the compensated data signal to the source electrode of the driving transistor for image display; and the compensation voltage is a voltage drop at the source electrode of the driving transistor relative to a reference voltage Vdd, wherein the at least one control voltage signal comprises a third test signal V3 outputted to a gate of the driving transistor to control the driving transistor to be in a blocking state and the reference voltage Vdd applied to the source of the driving transistor, the voltage drop being a difference between the measured source voltage of the driving transistor and a reference source voltage value.

Optionally, the reference source voltage value is one of a maximum value and a minimum value among all measured source voltages of all driving transistors in all pixel structures.

Optionally, the driving transistor is a P-type transistor and the third test signal V3 is multiplexed as the reference voltage Vdd.

Optionally, the control voltage signal further comprises a fourth test signal V4; the method of driving the pixel structure further comprising discharging cathode voltage of the light-emitting device by applying the fourth test signal V4 to the drain of the driving transistor.

In another aspect, the present invention provides a display apparatus, comprising a pixel driving chip described herein; and a pixel structure comprising a light-emitting device; a driving transistor having the drain electrode coupled to the light-emitting device; and a state-control unit configured to be coupled between the pixel driving chip and the driving transistor for controlling the driving transistor upon receiving the at least one control voltage signals from the pixel driving chip; wherein the driving transistor is configured to receive the compensated signal for image display obtained by compensating the original signal with the compensation voltage; the compensation voltage is computed based on a measured source voltage acquired at a source electrode of the driving transistor under control of the at least one control voltage signals.

Optionally, the original signal is one of a gate scanning signal provided to a gate electrode of the driving transistor and a data signal provided to the source electrode of the driving transistor.

Optionally, the compensated signal is a compensated gate scanning signal, and the output circuit is configured to output the compensated gate scanning signal to a gate electrode of the driving transistor; the compensation voltage is a threshold voltage of the driving transistor, wherein the at least one control voltage signals comprises a first test signal V1 and a second test signal V2; and the state-control unit comprises a first switching unit and a second switching unit, the first switching unit having a first terminal configured to be connected to the pixel driving chip for receiving the first test signal V1 and a second terminal connected to a gate of the driving transistor, the second switching unit having a first terminal configured to be connected to the pixel driving chip for receiving the second test signal V2 and a second terminal connected to a drain electrode of the driving transistor, each of the first switching unit and the second switching unit having a control terminal configured to be coupled to the pixel driving chip for switching on and off each of the first switching unit and the second switching unit, respectively, the threshold voltage of the driving transistor being a difference between the measured source voltage and the first test signal V1.

Optionally, the compensated signal is a compensated data signal, and the output circuit is configured to output the compensated data signal to the source electrode of the driving transistor, the compensation voltage is a voltage drop at the source electrode of the driving transistor relative to a reference voltage Vdd, wherein the set of control voltage signals comprises a third test signal V3 and the reference voltage Vdd; and the state-control unit comprises a first switching unit and a third switching unit, the first switching unit having a first terminal configured to be connected to the pixel driving chip for receiving the third test signal V3 and a second terminal connected to a gate of the driving transistor, the third switching unit having a first terminal configured to be connected to the pixel driving chip for receiving the reference voltage Vdd and a second terminal connected to the source electrode of the driving transistor, each of the first switching unit and the third switching unit having a control terminal coupled to the pixel driving chip for switching on and off each of the first switching unit and the third switching unit, respectively.

Optionally, the driving transistor is a P-type transistor and the third test signal V3 is multiplexed as the reference voltage Vdd.

Optionally, the state control circuit further comprises a fourth switching unit, the fourth switching unit comprising a thin film transistor having a first terminal configured to be connected to the pixel driving chip for receiving a clearing voltage signal V4 for discharging cathode voltage of the light-emitting device and a second terminal connected to a drain electrode of the driving transistor, the fourth switching unit having a control terminal configured to be connected to the pixel driving chip for receiving a control signal for switching on and off the fourth switching unit.

Optionally, the pixel structure further comprises a fifth switching unit having a thin film transistor coupled between the drain of the driving transistor and a cathode of the light-emitting device, the thin film transistor of the fifth switching unit having a control terminal configured to be connected to the pixel driving chip for receiving a control signal, the control signal being configured to turn off the thin film transistor of the fifth switching unit before the set of control voltage signals is outputted from the pixel driving chip to the driving transistor; and configured to turn on the thin film transistor of the fifth switching unit after the set of control voltage signals is outputted from the pixel driving chip to the driving transistor.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
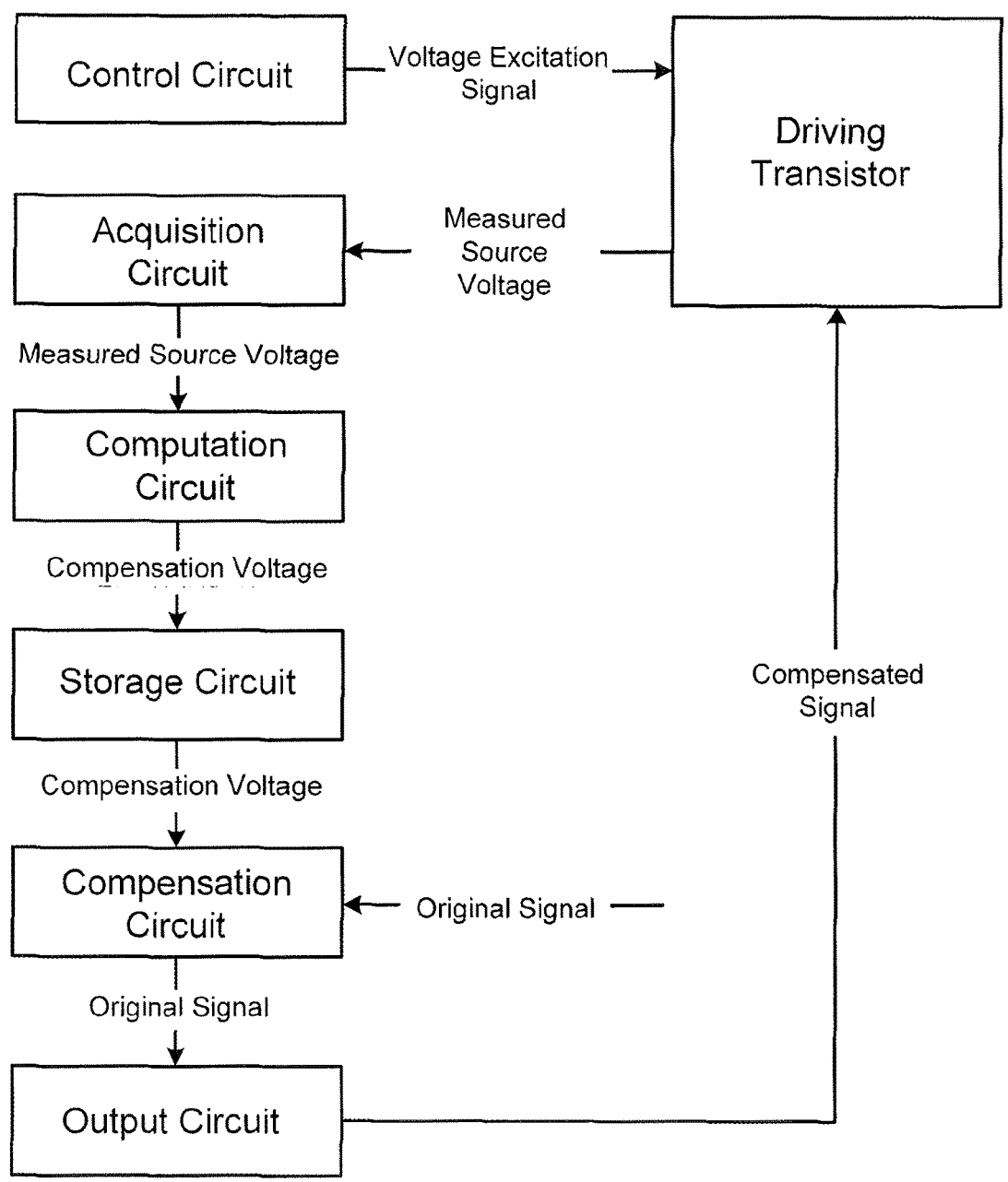
FIG. 1 is a simplified block diagram of a pixel driving chip according to an embodiment of the present disclosure.

The disclosure will now describe more specifically with reference to the following embodiments. It is to be noted that the following descriptions of some embodiments are presented herein for purpose of illustration and description only. It is not intended to be exhaustive or to be limited to the precise form disclosed.

In the active matrix type OLED apparatuses, each image display pixel structure includes a thin film transistor for driving a light emission diode (a.k.a. a driving transistor). The driving transistor has a threshold voltage value that drifts over its operation time. Different driving transistors throughout the display apparatus may have different threshold voltages. Typically, the threshold voltages of corresponding driving transistors in the active matrix OLED apparatuses are compensated to overcome non-uniform image display. Moreover, power-supply voltage has different voltage drops in different pixels because a distance between each pixel structure and the power supply signal node varies from pixel to pixel. Accordingly, the non-uniform voltage drops in some display apparatus are also compensated to further enhance image display uniformity.

Two compensation modes may be implemented for compensating the threshold voltage and the voltage drop associated with each pixel structure. A first compensation mode is a circuit compensation mode, in which a voltage-compensation circuit is included in each pixel structure. A second compensation mode is a driving compensation mode, in which voltages of signals applied to each pixel structure are compensated.

In the driving compensation mode, it is required to determine a threshold voltage of each driving transistor or a voltage drop over each pixel structure. The signals applied to each pixel structure (e.g., a gate scanning signal provided to a gate electrode of the driving transistor and a data signal provided to a source electrode of the driving transistor) are compensated for achieving a more uniform image display. In conventional driving compensation mode, the threshold voltage and the voltage drop of the driving transistor of each pixel structure are collected via a multiplexed display signal during a normal operation of the display apparatus. In order to ensure a normal and accurate image display, all the display signals are determined and cannot be changed. Therefore, the conventional driving compensation mode is disadvantageous because the compensation process is uncontrollable and inflexible.

The present disclosure provides a pixel driving chip, a driving method thereof, and a pixel structure controlled by the pixel driving chip that substantially obviates one or more of the problems due to limitations and disadvantages of the related art. In one aspect, the present disclosure provides a pixel driving chip for compensating an original signal provided to a pixel structure including a driving transistor having a drain electrode coupled to a light-emitting device. In some embodiments, the pixel driving chip includes a control circuit configured to generate one or more control voltage signals for controlling the driving transistor to be in a corresponding testing state; an acquisition circuit configured to acquire a measured source voltage at a source electrode of the driving transistor under the testing state corresponding to the one or more control voltage signals; a computation circuit configured to compute a compensation voltage based on the measured source voltage; a storage circuit configured to store the compensation voltage; a compensation circuit configured to compensate the original signal provided to the driving transistor using the compensation voltage stored in the storage circuit to obtain a compensated signal; and an output circuit configured to output the compensated signal to the driving transistor. The control voltage signals are independent from any working signal for the pixel structure, such as data signal and switching signal, etc. Thus, controlling of the driving transistor by such control voltage signal to be a certain testing state is unaffected by normal operations of the pixel structure. Voltage compensation of the original signal may be achieved with great controllability and flexibility.

In a first phase ("threshold voltage measurement phase), the control circuit configured to generate at least one control voltage signals for controlling the driving transistor to be in a conducting state while the driving transistor is isolated from a power-supply voltage Vdd. The original signal is a gate scanning signal provided to a gate electrode of the driving transistor, the compensated signal is a compensated gate scanning signal, the compensation voltage is a threshold voltage of the driving transistor, and the output circuit is configured to output the compensated gate scanning signal to a gate electrode of the driving transistor for image display. The at least one control voltage signals include a first test signal V1 outputted to a gate electrode of the driving transistor and a second test signal V2 outputted to a drain electrode of the driving transistor to control the driving transistor to be in a conducting state, while the driving transistor is isolated from a power-supply voltage Vdd, The threshold voltage is a difference between the measured source voltage and the first test signal V1

In a second phase ("voltage-drop measurement phase), the control circuit configured to generate at least one control voltage signals for controlling the driving transistor to be in a blocking state while the driving transistor is connected to the power-supply voltage Vdd. The original signal is a data signal provided to the source electrode of the driving transistor, the compensated signal is a compensated data signal, the compensation voltage is a voltage drop at the source electrode of the driving transistor relative to a reference voltage Vdd, and the output circuit is configured to output the compensated data signal to the source electrode of the driving transistor for image display. The at least one control voltage signals include a third test signal V3 outputted to a gate electrode of the driving transistor to control the driving transistor to be in a blocking state and the reference voltage Vdd applied to the source of the driving transistor. The voltage drop being a difference between the measured source voltage of the driving transistor and a reference source voltage value.

Optionally, the light emitting device is an organic light emitting diode. Optionally, the light emitting device includes at least a liquid crystal layer, a common electrode, and a pixel electrode.

Optionally, the original signal includes a gate scanning signal provided to a gate electrode of the driving transistor and a data signal provided to a source electrode of the driving transistor. Optionally, the original signal is a gate scanning signal. Optionally, the original signal is a data signal.

In some embodiments, the pixel driving chip is used to generate and output one or more voltage excitation signals (i.e., control voltage signals) for controlling a driving transistor to a corresponding testing state by at least controlling its gate voltage Vf and its drain voltage Vd. Optionally, the pixel driving chip generates a plurality sets of voltage excitation signals corresponding to a plurality sets of Vf and Vd. Different voltage excitation signals correspond to different Vf and Vd values. A source voltage Vs at the source electrode of the driving transistor is measured for each set of voltage excitation signals corresponding to each testing state.

In some embodiments, the original signal is a gate scanning signal, the compensated signal is a compensated gate scanning signal, and the output circuit is configured to output the compensated gate scanning signal to a gate of the driving transistor. Optionally, the compensation voltage is a threshold voltage of the driving transistor. The threshold voltage of the driving transistor, Vth, may be determined based on an equation Vs=Vf−Vth. Various threshold voltages Vth at different drain and source voltage conditions (varied by varying the voltage excitation signals under control by the pixel driving chip) can be obtained based on the measured source voltage Vs acquired under these conditions. Accordingly, a compensation voltage for compensating an original signal for driving the pixel can be computed.

In some embodiments, the original signal is a data signal, the compensated signal is a compensated data signal, and the output circuit is configured to output the compensated data signal to the source electrode of the driving transistor. Optionally, the compensation voltage is a voltage drop at the source electrode of the driving transistor relative to a power-supply voltage Vdd. Optionally, the one or more voltage excitation signals control the driving transistor to be in a blocking state. The voltage drop is determined as a difference between the measured source voltage of the driving transistor and a reference source voltage value. The reference source voltage value may be any appropriate value. For example, the reference source voltage value may be a maximum value among all measured source voltages of all driving transistors in all pixel structures. Optionally, the reference source voltage value is a minimum value among all measured source voltages of all driving transistors in all pixel structures. Optionally, the reference source voltage value is a medium or average value among all measured source voltages of all driving transistors in all pixel structures.

In some embodiments, the present disclosure provides a pixel driving chip configured to output a compensated signal to a pixel structure. The pixel structure includes at least a light-emitting device coupled or driven by a driving transistor. Optionally, the light-emitting device is an organic light emitting diode. Optionally, the light-emitting device is an active-matrix driven organic light emitting diode. FIG. 1 is a simplified block diagram of a pixel driving chip according to an embodiment of the present disclosure. As shown in FIG. 1, the pixel driving chip includes a control circuit configured to generate and output one or more voltage excitation signals, and provide it to a driving transistor for controlling the transistor state to be a testing state corresponding to one or more voltage excitation signals. These voltage excitation signals are independent from the work signals such as data signal and switching signal for operating associated pixel structure. Further, the pixel driving chip includes an acquisition circuit configured to acquire a plurality of measured source voltages at the source electrode of the driving transistor under a plurality of testing states. The plurality of testing states correspond to varying gate voltages and drain voltages of the driving transistor, in response to varying voltage excitation signals generated by the control circuit. Moreover, the pixel driving chip includes a computation circuit configured to compute a compensation voltage based on the measured source voltages obtained from the driving transistor under the testing states.

In some embodiments, the compensation voltage is a threshold voltage of the driving transistor. Optionally, the threshold voltage may be determined as the difference between a gate voltage and the measured source voltage at the source electrode while the source electrode of the driving transistor is isolated from the power-supply voltage Vdd. In some embodiments, the compensation voltage is a voltage drop at the source electrode of the driving transistor relative to a power-supply voltage when the driving transistor is kept at an off-state. The normal operation of the pixel structure for image display may be conducted after the compensation voltage is obtained. Thus, the acquisition and computation of compensation voltage (e.g., the threshold voltage and the voltage drop) do not affect the normal operation of the pixel structure for image display. The compensation voltage compensates the threshold voltage of the driving transistor, the voltage drop at the source of the driving transistor relative to the power-supply voltage, or both. By having the present pixel driving chip, effects of variations and non-uniformity in the threshold voltage or the voltage drop throughout the display panel on the image display may be significantly reduced. Higher image display quality with much reduced intensity irregularities throughout the display panel may be achieved.

Referring to FIG. 1, the pixel driving chip further includes a storage circuit configured to store the compensation voltage and a compensation circuit configured to compensate the original signal provided to the driving transistor using the compensation voltage stored in the storage circuit to obtain a compensated signal. Moreover, the pixel driving chip in FIG. 1 further includes an output circuit configured to output the compensated signal to the driving transistor for driving the light-emitting device of the pixel structure for image display substantially free from the effect of threshold voltage Vth drift and non-uniformity or variation of voltage drop relative to Vdd. As such, the pixel structure displays a pixel image more accurately with less intensity irregularity. The compensation process described herein will not affect normal operation of the pixel structure for image display. A simplified signal line design may be used for signal compensation.

For each pixel structure, the threshold voltage Vth of the driving transistor drifts over an elongated time. Typically, the threshold voltage stays relatively stable during a relatively short period of time (e.g., a continuous working period such as a week of working time). When the pixel driving chip is in the compensation mode, it takes certain time and processing resource to obtain the threshold voltage or the voltage drop. Thus, frequent acquisition of the threshold voltage or the voltage drop may be time-consuming and take up a large amount of processing resources. Accordingly, in some embodiments, a single compensation voltage value may be used for a continuous working period for balancing compensation accuracy and consumption of time and processing resource. For example, the single compensation voltage value may be computed based on the threshold voltage or voltage drop obtained every time when the pixel structure is powering up (for intended normal image display), the single compensation voltage value may be used throughout the working period. In some embodiments, a compensation voltage value may be computed based on the threshold voltage or voltage drop obtained every time when the pixel structure is shut down, and the compensation voltage value may be used throughout the working period when the pixel structure is powering up next time. In some embodiments, a compensation voltage value may be obtained between two adjacent frames of image, and the compensation voltage value so obtained may be used for the next frame of image.

Figure 2:
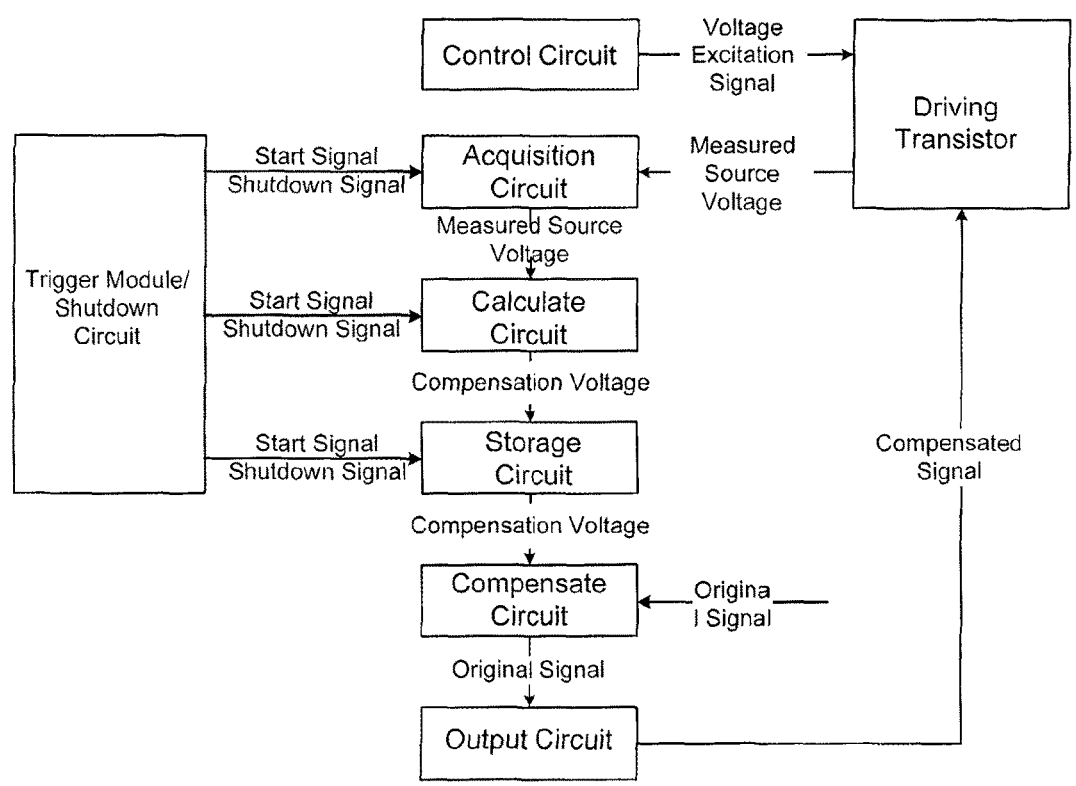
FIG. 2 is simplified block diagram of a pixel driving chip according to another embodiment of the present disclosure.

FIG. 2 is simplified block diagram of a pixel driving chip according to another embodiment of the present disclosure. As shown, the pixel driving chip of FIG. 2 includes a trigger circuit and a shutdown circuit in combination with the pixel driving chip of FIG. 1. Optionally, the trigger circuit is configured to trigger operations of the acquisition circuit, computation circuit, and storage circuit of the pixel driving chip, e.g., during powering up of the pixel structure for image display. Optionally, the shutdown circuit is configured to shut down the acquisition circuit, computation circuit, and storage circuit after the aforementioned compensation voltage is obtained and stored.

The pixel driving chip of FIG. 2 has several advantages. Even though the threshold voltage of the driving transistor slowly drifts over time, it may still maintain a relatively stable value over a certain continuous working time. For example, in some embodiments, during a continuous working time from powering up to shutting down, a single compensation voltage may be sufficient to achieve satisfactory voltage compensation accuracy in a display apparatus having the pixel driving chip described herein. By using a single compensation voltage in the time period from powering up to shutting down, consumption of time and processing resource may be significantly reduced as compared to an embodiment requiring more frequent acquisition of compensation voltage values. Valuable processing resource may be allocated to display data processing. Display delay may be avoided and display quality enhanced.

Optionally, the compensation voltage is a threshold voltage of the driving transistor. Optionally, the compensation voltage is a voltage drop at the source electrode of the driving transistor relative to a power-supply voltage Vdd. Optionally, the compensation voltage includes both the threshold voltage of the driving transistor and the voltage drop at the source electrode of the driving transistor relative to a power-supply voltage Vdd. For example, the pixel driving chip may be configured to compensate one or both of a gate scanning signal and a data signal.

Figure 3:
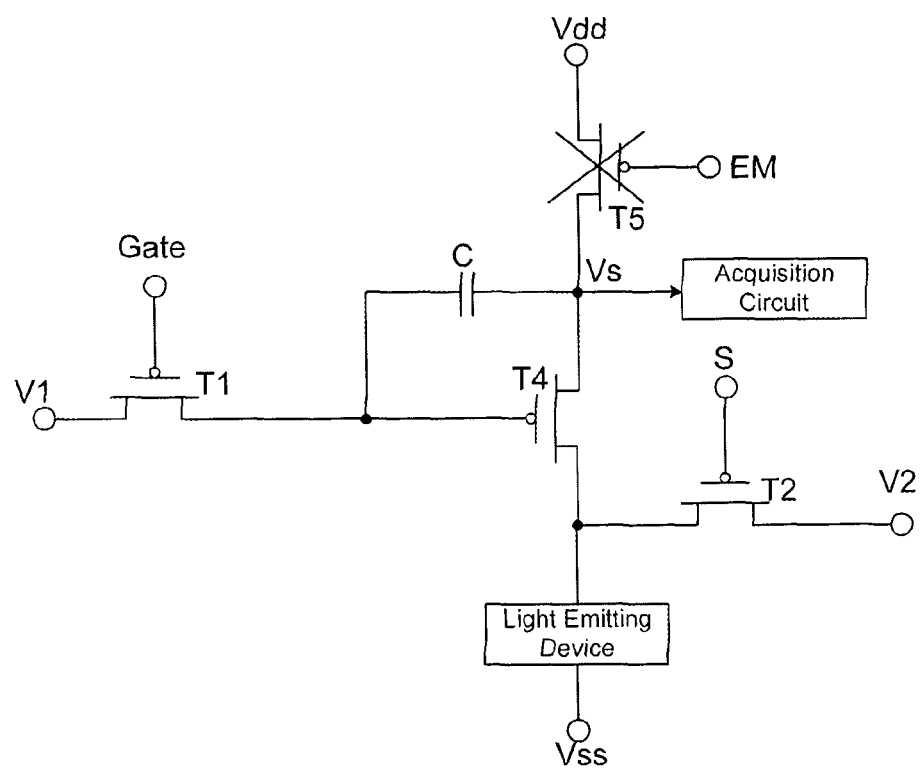
FIG. 3 is a circuit diagram of a pixel structure during measurement of threshold voltage of a driving transistor according to some embodiments of the present disclosure.

In some embodiments, the compensation voltage is a threshold voltage of the driving transistor, i.e., the pixel driving chip is configured to compensate the gate scanning signal. FIG. 3 is a circuit diagram of a pixel structure during measurement of threshold voltage of a driving transistor according to some embodiments of the present disclosure. In order to measure a threshold voltage of a driving transistor (in the pixel structure), at least two test signals are needed to output to the driving transistor, as shown in FIG. 3. A first test signal V1 is one voltage excitation signal outputted to a gate of the driving transistor T4. A second test signal V2 is another voltage excitation signal outputted to a drain electrode of the driving transistor T4. By adjusting values of V1 and V2, it is able to control the driving transistor to be in a testing state so that various values of the threshold voltage Vth (equal to a gate voltage minus a drain voltage) can be acquired.

Optionally, when a first switching unit (which is referred as a thin film transistor T1 in FIG. 3) is in a conduction state as controlled by a scanning signal Gate and a second switching unit (which is referred as another thin film transistor T2 in FIG. 3) is in a conduction state as controlled by a sensor signal S, the first test signal V1 and the second test signal V2 are respectively passed to the gate and the drain of the driving transistor T4. During this phase, the thin film transistor T5 connected between the power-supply Vdd and the source of the driving transistor T4 is set to be a blocking state by an emission control signal EM so that the power-supply voltage Vdd cannot be passed to the source electrode of the driving transistor T4. An acquisition circuit coupled to the source electrode of the driving transistor T4 acquires a measured source voltage of the driving transistor under the control of both the first test signal V1 and the second test signal V2. A threshold voltage of the driving transistor T4 in this testing state may be obtained as the difference between the measured source voltage and the first test signal V1 passed onto the gate of T4.

The threshold voltage of a driving transistor may change within a certain range when the source voltage and drain voltage at the source electrode and drain electrode change. In order to obtain a more accurate threshold voltage of the driving transistor at a specific bias state with different drain-source voltages, the pixel driving chip in some embodiments is configured to acquire multiple threshold voltages corresponding to different source and drain voltages, and store them into a storage circuit. During image display, one of the multiple threshold voltages stored in the storage circuit may be selected based on actual source and drain voltage in a specific frame of image. By having this design, a more accurate voltage compensation may be achieved.

Referring to FIG. 1 and FIG. 2, a control circuit in the embodiments is configured to output multiple sets of voltage excitation signals having different values to the driving transistor. Each set of voltage excitation signals is able to control the driving transistor to be in a testing state (e.g., a threshold voltage testing state). A storage circuit in the pixel driving chip is configured to store each threshold voltage corresponding to each set of voltage excitation signals.

In some embodiments, the compensation circuit includes a matching unit configured to determine one set of voltage excitation signals out of the multiple sets of voltage excitation signals that matches with actual source and drain voltage in the specific frame of image. For example, in each frame of image, the source voltage is provided by a data signal. The matching unit is configured to determine one set (a matched set) of voltage excitation signals out of the multiple sets of voltage excitation signals that matches with a data signal in a specific frame of image. Optionally, the matching is performed by selecting one set of voltage excitation signals out of the multiple sets of voltage excitation signals that has a measured source voltage closest to the actual data signal provided at the source electrode in the specific frame of image. Optionally, the matching is performed by selecting one set of voltage excitation signals out of the multiple sets of voltage excitation signals that has a drain voltage closest to the drain voltage provided at the drain electrode in the specific frame of image. Optionally, the drain voltage provided at the drain electrode in the specific frame of image may be calculated based on the source voltage provided at the source electrode and inherent physical parameters of the driving transistor.

In some embodiments, the compensation circuit also includes a compensation unit configured to use the threshold voltage corresponding to the matched set of voltage excitation signal to perform voltage compensation to the original signal (e.g., an original gate scanning signal) to obtain a compensated signal (e.g., a compensated gate scanning signal).

Referring to FIG. 3, when the power-supply voltage Vdd is maintained unchanged and a voltage signal applied to the gate of the driving transistor T4 (i.e., a gate scanning signal) is changed, the drain voltage of T4 undergoes change corresponding to the changing gate voltage. Optionally, the drain voltage has a one-to-one correspondence with the voltage signal applied to the gate of T4. Thus, in some embodiments, by changing the first and second test signals V1 and V2, multiple sets of threshold voltages can be obtained. Each threshold voltage corresponds to a different Vds, i.e., drain-source voltage difference of the driving transistor T4.

During a normal operation process of a display apparatus, a drain voltage corresponding to any set of original signal (e.g., a gate scanning signal and a data signal) may be calculated based on inherent physical parameters of the driving transistor, e.g., to obtain a calculated drain voltage. For example, a matched set may be determined by conducting a search in the storage circuit to select a set of voltage excitation signals having a second test signal V2 closest to the calculated drain voltage. The threshold voltage corresponding to the matched set may be used for compensating the original signal to obtain a compensated signal.

In some embodiments, the matching unit determines a matched set out of the multiple sets of voltage excitation signals that matches with the original signal. The compensation unit uses the threshold voltage corresponding to the matched set to compensate the original signal to obtain the compensated signal.

Figure 4:
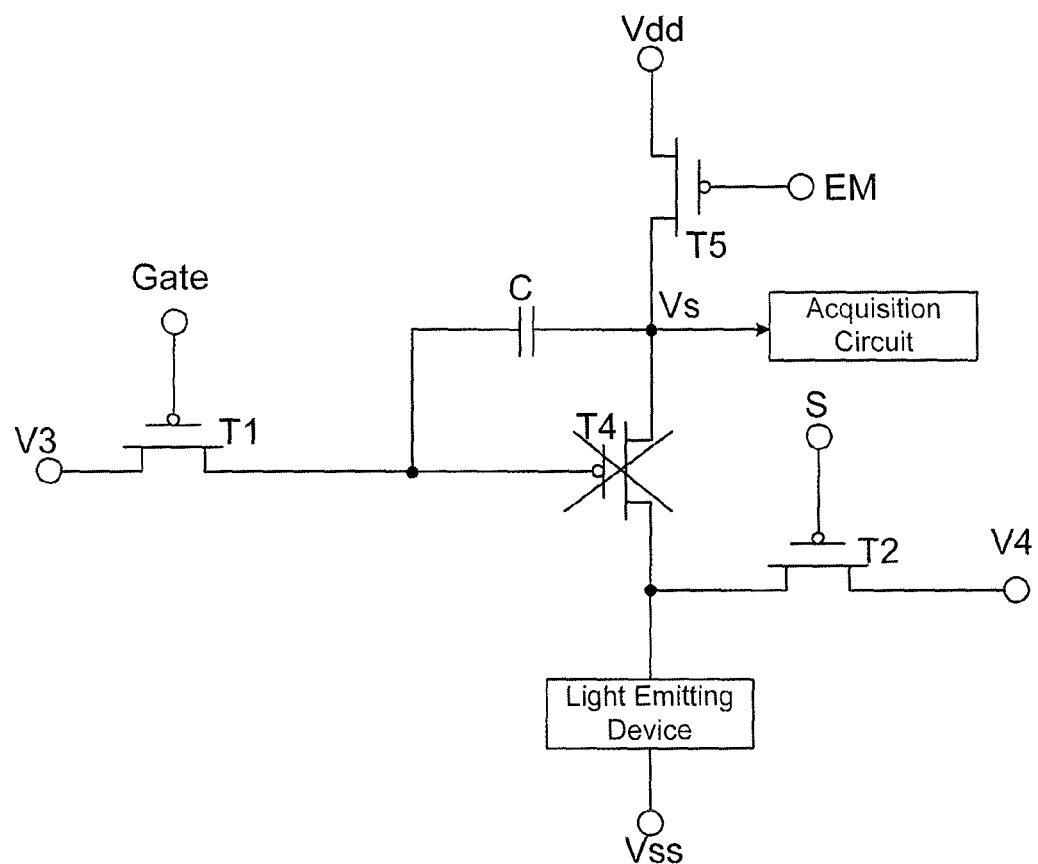
FIG. 4 is a circuit diagram of a pixel structure during measurement of voltage drop across the driving transistor according to some embodiments of the present disclosure.

In some embodiments, the compensation voltage is a voltage drop at the source electrode of the driving transistor relative to a power-supply voltage Vdd, i.e., the pixel driving chip is configured to compensate the data signal provided at the source electrode of the driving transistor. FIG. 4 is a circuit diagram of a pixel structure during measurement of voltage drop across the driving transistor according to some embodiments of the present disclosure. In order to measure a voltage drop at the source electrode of the driving transistor, at least two test signals are needed to output to the driving transistor, as shown in FIG. 4. A third test signal V3 is outputted from the pixel driving chip to the gate of the driving transistor T4. A fourth test signal Vdd (i.e., a power-supply voltage signal) is outputted to the source of the driving transistor T4. When the first switching unit (referred to as the first thin film transistor T1 in FIG. 4) is in a conduction state under the control of a scanning signal Gate, the third test signal V3 is passed to the gate of the driving transistor T4. Under the control of V3, the driving transistor T4 is set to be in a blocking state. In the pixel driving chip as shown in FIG. 4, the second switching unit, e.g., the thin film transistor T2, is not involved in this compensation scheme. When a third switching unit (referred to as the fifth thin film transistor T5 in FIG. 4) is in a conduction state under the control of an emission control signal Em, the power-supply voltage signal Vdd is applied to the source of the driving transistor T4. Thus, the acquisition circuit in the pixel driving chip can obtain the measured source voltage at the source of the driving transistor T4. Optionally, measured source voltages for all driving transistors of all pixel structures of a display apparatus are obtained by the acquisition circuit.

In some embodiments, by comparing the measured source voltages of all pixel structures, a voltage drop at the source of the driving transistor relative to the power-supply voltage can be obtained. Optionally, the voltage drop of the source of the driving transistor relative to the power-supply voltage is determined as a difference between the measured source voltage of the current one driving transistor and a reference source voltage value. The reference source voltage value may be any appropriate value. For example, the reference source voltage value may be a maximum value among all measured source voltages of all driving transistors in all pixel structures. Optionally, the reference source voltage value is a minimum value among all measured source voltages of all driving transistors in all pixel structures. Optionally, the reference source voltage value is a medium or average value among all measured source voltages of all driving transistors in all pixel structures.

In some embodiments, the one or more voltage excitation signals further includes a fourth test signal V4. Referring to FIG. 4, in the above embodiment with the compensation voltage being the voltage drop, a clear signal V4 may be applied to the drain of the driving transistor for discharging cathode voltage of the light-emitting device. Specifically, a control signal S may be set to make the second transistor T2 in a conduction state, the test signal V4 passes from the pixel driving chip to the drain of the driving transistor T4. The test signal V4 is able to discharge cathode voltage of a light-emitting (diode) device to obtain more accurate measurement results of the measured source voltage.

As shown in FIG. 3 and FIG. 4, at least two voltage excitation signals are needed to obtain a compensation voltage (e.g., a threshold voltage or a voltage drop). As shown in FIG. 4, when measuring the voltage drop, the driving transistor T4 is set to a blocking state. To minimize the number of the voltage excitation signals, in a specific embodiment, the driving transistor is a P-type transistor and the third test signal V3 is the same as the power-supply voltage signal Vdd (e.g., the third test signal V3 is multiplexed as the power-supply voltage signal Vdd).

Figure 5:
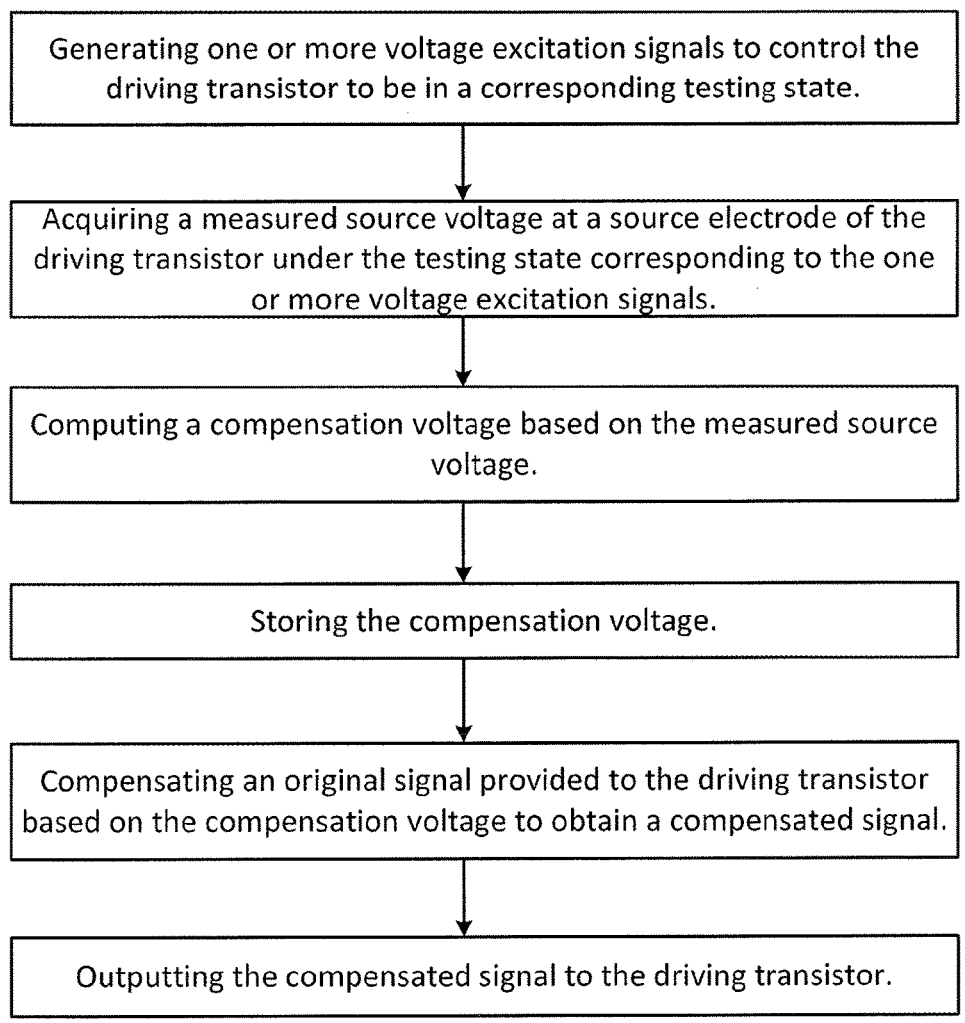
FIG. 5 is a flow chart illustrating a method for driving a pixel structure with a voltage compensation according to an embodiment of the present disclosure.

In another aspect, the present disclosure provides a method of driving a pixel structure including a driving transistor having a drain electrode coupled to a light-emitting device. FIG. 5 is a flow chart illustrating a method for driving a pixel structure with voltage compensation according to an embodiment of the present disclosure. Referring to FIG. 5, the method in the embodiment includes generating one or more voltage excitation signals to control the driving transistor to be in a corresponding testing state; acquiring a measured source voltage at a source electrode of the driving transistor under the testing state corresponding to the one or more voltage excitation signals; computing a compensation voltage based on the measured source voltage; storing the compensation voltage; compensating an original signal provided to the driving transistor using the compensation voltage to obtain a compensated signal; and outputting the compensated signal to the driving transistor.

In some embodiments, the original signal is a gate scanning signal, the compensated signal is a compensated gate scanning signal, and the output circuit is configured to output the compensated gate scanning signal to a gate of the driving transistor. Optionally, the compensation voltage is a threshold voltage of the driving transistor. The one or more voltage excitation signals includes a first test signal V1 outputted to a gate of the driving transistor and a second test signal V2 outputted to a drain electrode of the driving transistor to control the driving transistor to be in a testing state. The threshold voltage is determined as a difference between the measured source voltage and the first test signal V1.

In some embodiments, the compensation voltage is a threshold voltage of the driving transistor, the step of generating one or more voltage excitation signals includes generating a plurality sets of the first test signal V1 and the second test signal V2 to control the driving transistor to be in corresponding threshold voltage testing states. Optionally, the step of storing the compensation voltage includes storing a threshold voltage corresponding to each set of the first test signal V1 and the second test signal V2. Optionally, the method further includes determining a matched set out of the plurality sets of the first test signal V1 and the second test signal V2 that matches with the original signal; and using the threshold voltage corresponding to the matched set to compensate the original signal to obtain the compensated signal.

Referring to FIG. 5, in a specific embodiment when the compensation voltage is a threshold voltage of the driving transistor, the voltage excitation signals include the first test signal V1 outputted to the gate of the driving transistor and the second test signal V2 outputted to the drain of the driving transistor. Both of the two test signals are used to control the driving transistor to be in a threshold testing state. A measured source voltage is obtained. By varying at least one of the two test signals, different threshold voltages of the driving transistor can be obtained. The threshold voltage of the driving transistor is a difference between the measured source voltage and the voltage of the first test signal V1.

Referring to FIG. 5, the control process of the driving method includes generating and outputting multiple sets of voltage excitation signals to the driving transistor. Each set of voltage excitation signals is able to control the driving transistor to be in the threshold testing state. The storage process of the driving method includes storing each threshold voltage corresponding to each set of voltage excitation signals. The compensation process includes determining one set of voltage excitation signals out of the multiple sets of voltage excitation signals that matches with the original signal, computing a threshold voltage corresponding to the one set of voltage excitation signals, and using the threshold voltage to perform a voltage compensation on the original signal to obtain a compensated signal.

In some embodiments, the original signal is a data signal, the compensated signal is a compensated data signal, and the output circuit is configured to output the compensated data signal to the source electrode of the driving transistor. Optionally, the compensation voltage is a voltage drop at the source electrode of the driving transistor relative to a power-supply voltage Vdd. The voltage excitation signal comprises a third test signal V3 outputted to a gate of the driving transistor and the power-supply voltage signal Vdd applied to the source of the driving transistor to control the driving transistor to be in a blocking state. The voltage drop is determined as a difference between the measured source voltage of the driving transistor and a reference source voltage value. The reference source voltage value may be any appropriate value. For example, the reference source voltage value may be a maximum value among all measured source voltages of all driving transistors in all pixel structures. Optionally, the reference source voltage value is a minimum value among all measured source voltages of all driving transistors in all pixel structures. Optionally, the reference source voltage value is a medium or average value among all measured source voltages of all driving transistors in all pixel structures.

Referring to FIG. 5, in a specific embodiment when the compensation voltage is determined to be a voltage drop, the voltage excitation signals include the third test signal V3 outputted to the gate of the driving transistor and the power-supply voltage Vdd outputted to the source of the driving transistor. Both of these signals are used to control the driving transistor to be in a blocking state. A measured source voltage is obtained for each of all pixel structures of entire display apparatus. The voltage drop at the source of the driving transistor relative to the power-supply voltage can be obtained as a difference between the measured source voltage for this driving transistor and a reference source voltage value.

Optionally, the driving transistor is a P-type transistor and the third test signal V3 is the same as the power-supply voltage signal Vdd, e.g., the third test signal V3 is multiplexed as the power-supply voltage signal Vdd. Optionally, the voltage excitation signal further includes a fourth test signal V4. Optionally, the method further includes discharging cathode voltage of the light-emitting device by applying the fourth test signal V4 to the drain of the driving transistor. For example, the voltage excitation signals further include a clear signal V4 outputted to the drain of the driving transistor. The clear signal V4 is configured to clear cathode voltage of the light-emitting device that is coupled to the drain of the driving transistor within the pixel structure.

In some embodiments, the method further includes a step of triggering for triggering processes of acquiring the measured source voltage, computing the compensation voltage based on the measured source voltage, and storing the compensation voltage during powering up of the pixel structure for image display. Optionally, the method further includes a step of ending for ending the processes of acquiring the measured source voltage, computing the compensation voltage based on the measured source voltage, and storing the compensation voltage after storing the compensation voltage to a storage circuit.

Figure 6:
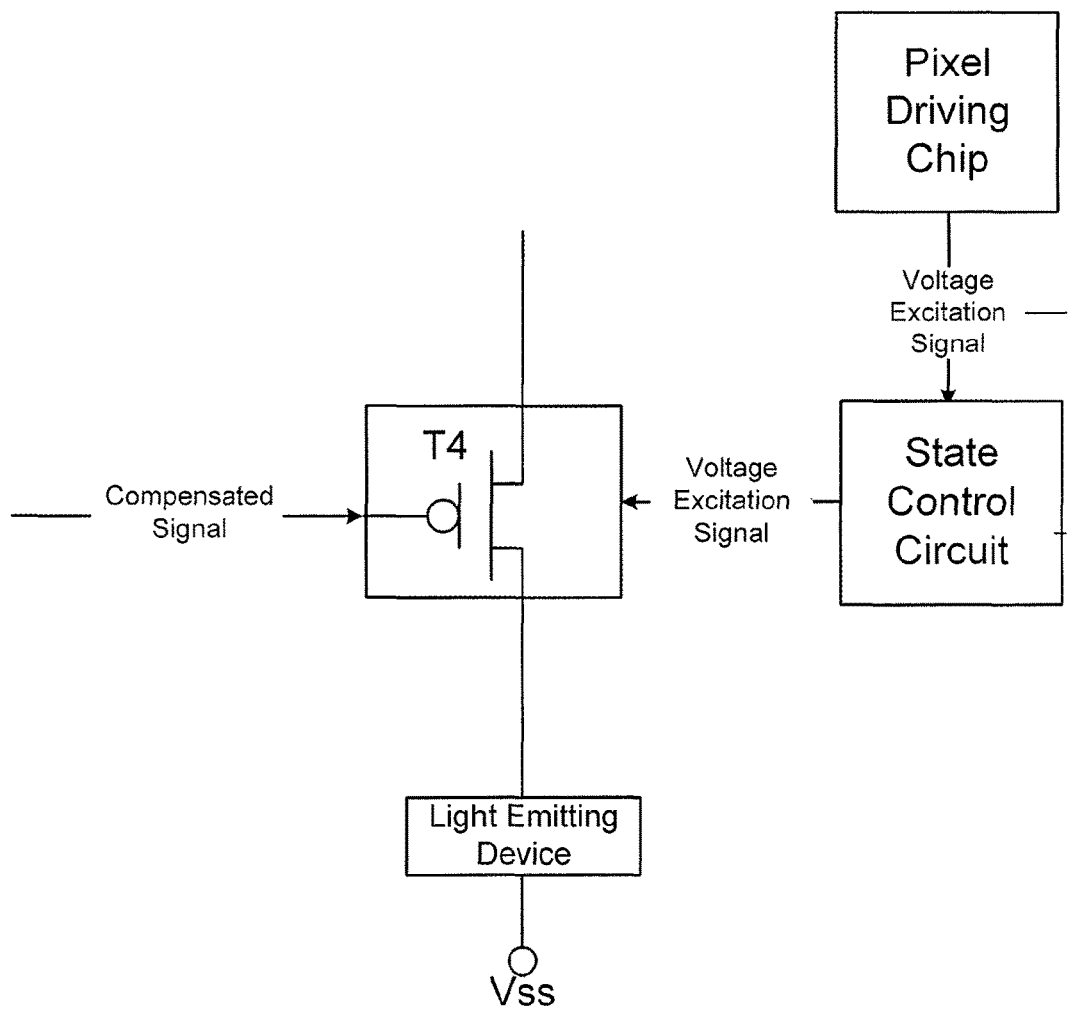
FIG. 6 is a simplified block diagram of a pixel structure according to an embodiment of the present disclosure.

In order to implement the voltage compensation to improve image display performance of an active matrix organic light-emitting device, a specific embodiment of the present disclosure provides a pixel structure including a light-emitting device (an OLED diode) coupled to a driving transistor T4. FIG. 6 is a simplified block diagram of a pixel structure according to the embodiment of the present disclosure. Referring to FIG. 6, the pixel structure includes a state control circuit coupled to the driving transistor T4. The state control circuit is coupled to a pixel driving chip to receive one or more voltage excitation signals and is configured to use the one or more voltage excitation signals to control the driving transistor T4 to be in a corresponding testing state. During a normal operation period of the pixel structure, the driving transistor has a gate receiving a compensated signal that is compensated over an original signal by a compensation voltage. The compensation voltage is obtained based on the measured source voltages acquired at the source of the driving transistor under the testing state corresponding to various values of the one or more voltage excitation signals. Optionally, the compensation voltage is a threshold voltage of the driving transistor. Optionally, the compensation voltage is a voltage drop at the source of the driving transistor relative to a power-supply voltage.

Figure 7:
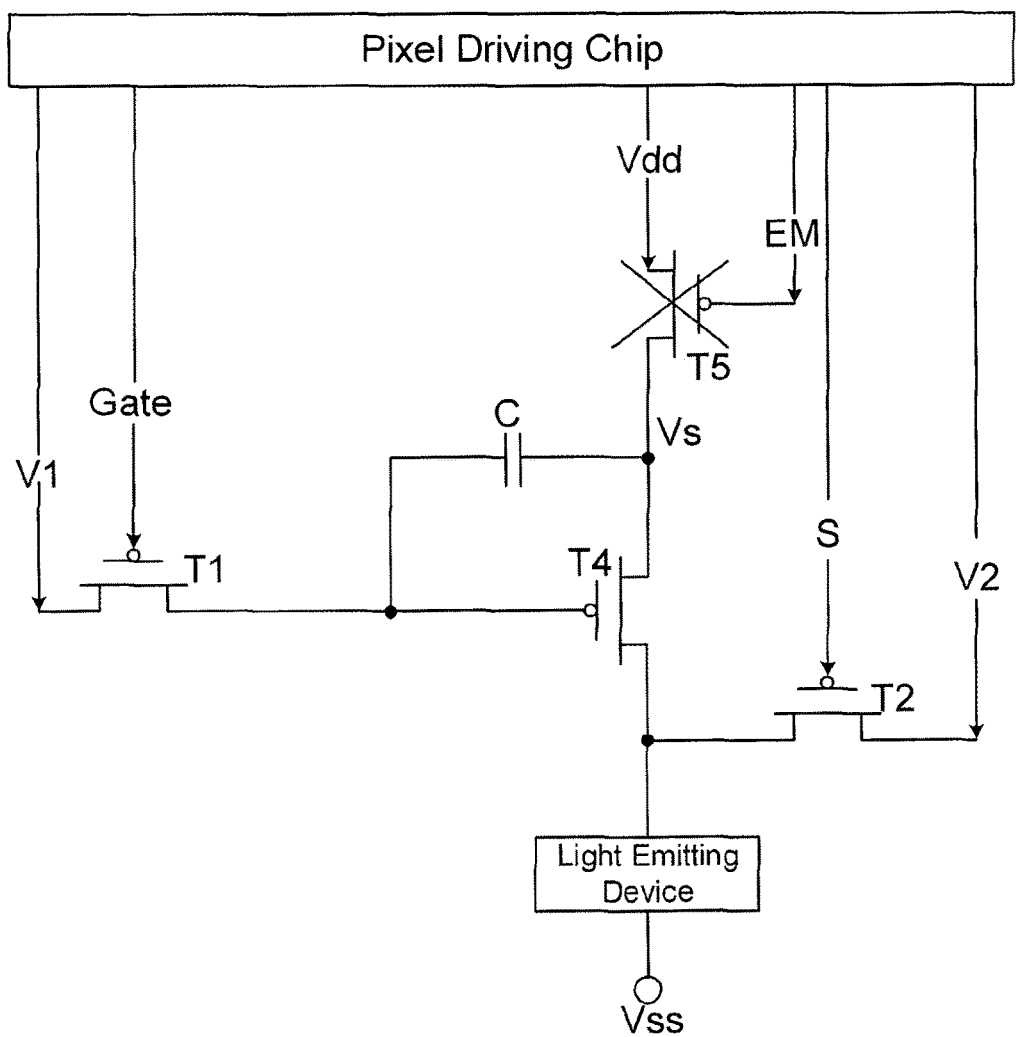
FIG. 7 is a diagram of a pixel structure controlled by a pixel driving chip operated during a threshold voltage compensation according to an embodiment of the present disclosure.

FIG. 7 is a diagram of a pixel structure controlled by a pixel driving chip operated during a threshold voltage compensation according to an embodiment of the present disclosure. Referring to FIG. 7, the voltage excitation signals include a first test signal V1 and a second test signal V2, outputted from the pixel driving chip. Optionally, the compensation voltage is a threshold voltage of the driving transistor, the state control circuit in FIG. 6 includes a first switching unit which is the thin film transistor T1 in FIG. 7. The first switching unit has a first terminal coupled to the pixel driving chip for receiving the first test signal V1 outputted from the pixel driving chip. The first switching unit has a second terminal coupled to a gate of the driving transistor T4.

Referring to FIG. 7, the state control circuit includes a second switching unit which is the thin film transistor T2 in FIG. 7. The second switching unit has a first terminal coupled to the pixel driving chip to receive the second test signal V2 outputted from the pixel driving chip. The second switching unit has a second terminal connected to a drain electrode of the driving transistor T4.

Each of the first switching unit T1 and the second switching unit T2 has a control terminal coupled to the pixel driving chip for receiving a control signal to control on and off states of T and T2. Specifically, the first switching unit T1 is controlled by a scanning signal Gate and the second switching unit T2 is controlled by a sensor signal S. In some embodiments, the measured source voltage is acquired and the threshold voltage of the driving transistor T4 is determined as a difference between the measured source voltage (measured at the source of the driving transistor) and a voltage value associated with the first test signal V1 passed to the gate of the driving transistor T4.

Figure 8:
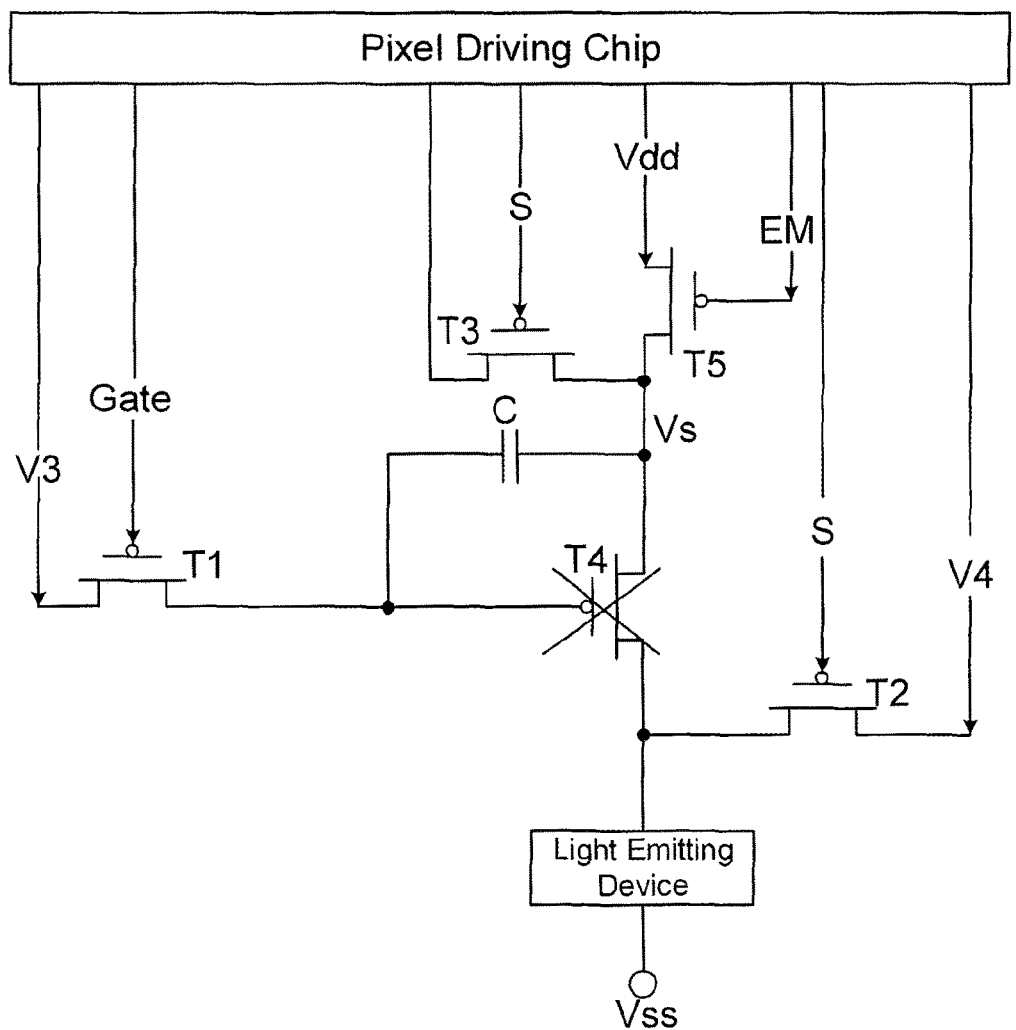
FIG. 8 is a diagram of a pixel structure controlled by a pixel driving chip operated during a voltage drop compensation according to an embodiment of the present disclosure.

FIG. 8 is a diagram of a pixel structure controlled by a pixel driving chip operated during a voltage drop compensation according to an embodiment of the present disclosure. Referring to FIG. 8, the voltage excitation signals include a third test signal V3 and a power-supply voltage Vdd, outputted from the pixel driving chip. Optionally, the compensation voltage is a voltage drop at the source of the driving transistor relative to a power-supply voltage signal, the state control circuit of FIG. 6 includes a first switching unit which is the thin film transistor T1 in FIG. 8. The first switching unit T1 has a first terminal connected to the pixel driving chip for receiving the third test signal V3 and a second terminal connected to the gate of the driving transistor T4. Moreover, the state control circuit includes a third switching unit which is the thin film transistor T5 in FIG. 8. The third switching unit T5 has a first terminal connected to the pixel driving chip for receiving the power-supply voltage Vdd and a second terminal connected to the source of the driving transistor T4.

Each of the first switching unit T1 and the third switching unit T5 has a control terminal connected to the pixel driving chip for receiving a control signal to control on and off states of T1 and T5. Specifically, the first switching unit T1 is controlled by a scanning signal Gate to pass the third test signal V3 to the gate of the driving transistor. When the third test signal V3 is passed to the gate of the driving transistor, it controls the driving transistor to be in a blocking state. The third switching unit T5 is controlled by an emission control signal Em to allow a voltage drop relative to the power-supply voltage Vdd at the source of the driving transistor T4. The driving transistor T4 is blocked. Optionally, the driving transistor T4 is chosen to be a P-type transistor, and the power-supply voltage Vdd may be used as the third test signal V3.

Further in FIG. 8, the state control circuit includes a second switching unit which is the thin film transistor T2. The second switching unit T2 has a first terminal connected to the pixel driving chip to receive a clear signal V4 that is used for clearing cathode voltage of the light-emitting device within the pixel structure. The second switching unit T2 as a second terminal connected to the drain of the driving transistor T4. The second switching unit T2 has a control terminal connected to the pixel driving chip for receiving a control signal S. The control signal S controls the on and off states of T2. Optionally, the control signal S in FIG. 8 may be provided by a same signal line that provides the sensor signal S for controlling the transistor T2 in FIG. 7. Optionally, the control signal S is a same signal as the sensor signal S.

In some embodiments, the state control circuit of FIG. 7 may further include a fourth switch unit which is the thin film transistor T3 shown in FIG. 8. The fourth switching unit T3 is controlled by a control signal S from the pixel driving chip for switching on or off. For example, during a sampling phase, the fourth switching unit T3 is set to a conduction state by the control signal S so that a measured source voltage can be read by sampling measurement and acquired by the pixel driving chip. While the pixel structure is in normal operation for image display, the fourth switching unit T3 is set to be in a blocking state by the control signal S. In some embodiment, the control signal S may be provided by a same signal line that provides the sensor signal S for controlling the transistor T2 in FIG. 7. Optionally, the control signal S is a same signal as the sensor signal S.

In some embodiments, the state control circuit may multiplex one or more existing thin film transistors in the pixel structure as one or more switching units for achieving desired state control. For example, one or more existing thin film transistors may be used as thin film transistors for image display in a normal image display mode, and may be used as thin film transistors in the state control circuit in the signal compensation mode.

Figure 9:
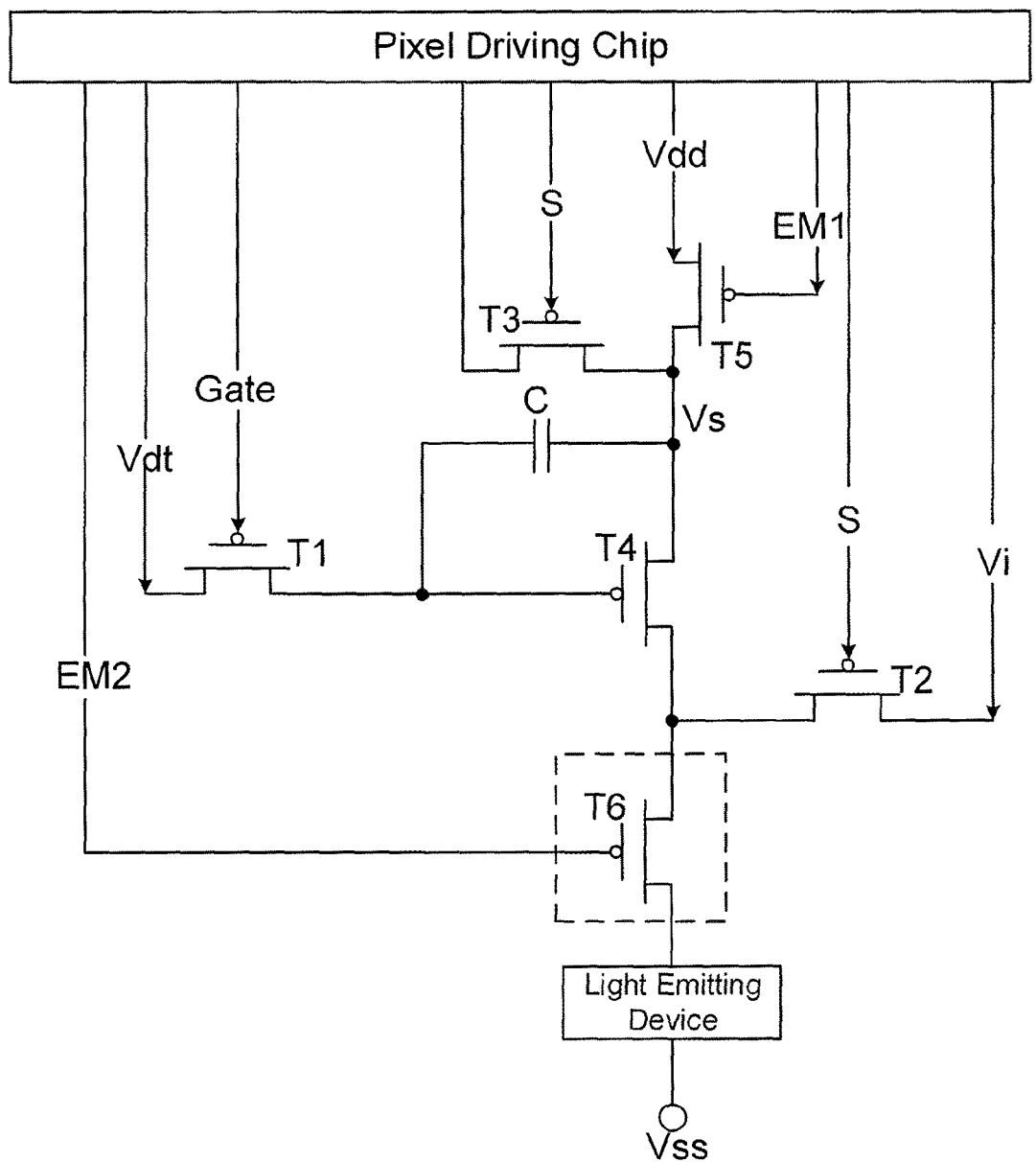
FIG. 9 is a diagram of a pixel structure controlled by a pixel driving chip operated for combined threshold voltage and voltage drop compensation according to an embodiment of the present disclosure.

FIG. 7 and FIG. 8 show two possible schemes for acquiring threshold voltages and voltage drops, respectively, at the source electrode of the driving transistor when a threshold voltage (FIG. 7) or a voltage drop (FIG. 8) is used as a compensation voltage for compensating an original signal against the threshold voltage drift or variations of the voltage drop at the source electrode of the driving transistor. In some embodiments, both the threshold voltage and the voltage drop at the source electrode are compensated. FIG. 9 is a diagram of a pixel structure controlled by a pixel driving chip operated for combined threshold voltage and voltage drop compensation according to an embodiment of the present disclosure. Referring to FIG. 9, the pixel structure includes a light-emitting device coupled to a driving transistor T4. A pixel driving chip is configured to provide multiple sets of voltage excitation signals and control signals such as the scanning signal Gate, the sensor signal S, the emission control signal EM, the power-supply voltage Vdd, etc. A state control circuit includes a first switching unit T1, a second switching unit T2, a third switching T5, and a fourth switching T3. The state control circuit is configured to receive the multiple sets of voltage excitation signals from the pixel driving chip for controlling the driving transistor and sampling measured source voltages of the driving transistor at the corresponding testing states. Further, the pixel driving chip is configured to compute a compensation voltage based on the sampled measured source voltages, which is used for compensating an original signal against both the threshold voltage drift of the driving transistor and variations of the voltage drop at the source of the driving transistor relative to the power-supply voltage so that a compensated signal can be outputted to the driving transistor for controlling the light-emitting device with stabilized light emission.

Referring to FIG. 9, the first, second, third, and fourth switching units are substantially the same as those discussed in FIG. 7 and FIG. 8, which are respectively provided as thin film transistors T1, T2, T3, and T5. Optionally, each of the thin film transistors T1, T2, T3, and T5 is an N-type transistor. Optionally, each of the thin film transistors T1, T2, T3, and T5 is a P-type transistor.

Figure 10:
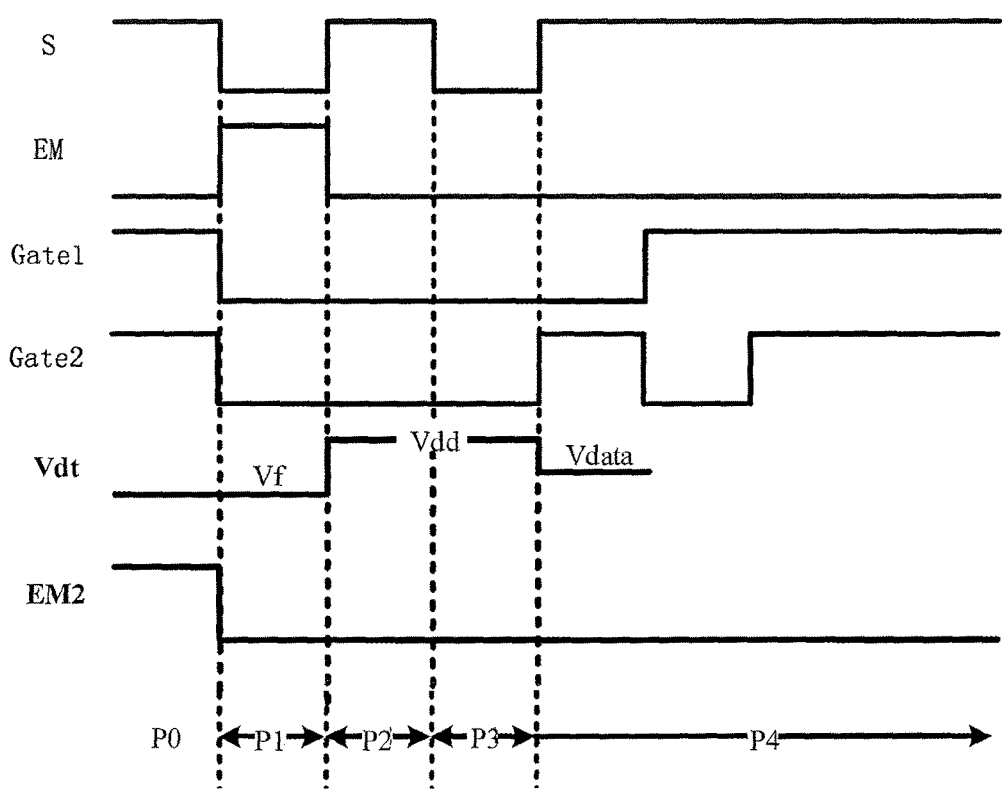
FIG. 10 is a simplified timing diagram for operating the pixel structure of FIG. 9 according to an embodiment of the present disclosure.

FIG. 10 is a simplified timing diagram for operating the pixel structure of FIG. 9 according to an embodiment of the present disclosure. Referring to FIG. 10, a driving operation of the pixel structure is illustrated by a timing diagram for each set of voltage excitation signals including S, EM1, EM2, Gate1 (Gate2), and Vdt, outputted from an external pixel driving chip. FIG. 10 illustrates a drying operation of a pixel structure in which the thin film transistors T1, T2, T3, and T5 are all P-type transistors.

Referring to FIG. 9 and FIG. 10, signal Vdt is substantially equivalent of the V1 in FIG. 7 or V3 in FIG. 8. Signal Vi of FIG. 9 is substantially equivalent of the V2 in FIG. 7 and V4 in FIG. 8. Optionally, the signal Vi is a fixed signal for clearing cathode voltage of light-emitting device (not included in the timing diagram of FIG. 10). Signal Gate1 is provided to the control terminal of T1 in a current row of pixel sturctures of a display apparatus, signal Gate2 is the control signal provided for a next row of pixel structures of the same display apparatus. Signal EM2 is provided to a control terminal of an optional transistor T6.

Referring to FIG. 9 and FIG. 10, in the P1 phase, the pixel driving chip acquires the threshold voltages of the driving transistor T4. Vdt is provided as a signal Vf and is applied to a gate electrode of the driving transistor T4. Vi is applied to a drain electrode of the driving transistor T4. Signal Gate1 (for current row of pixel structures) is at a low level, signal S is at the low level, and signal EM1 is at the high level. As a result, T1, T2, T3 are in conduction states and T5 is in a blocking state. As the source electrode of the driving transistor T4 has a starting voltage at Vdd (at last image display phase), Vf controls the gate of the driving transistor T4 and Vi set the drain voltage of the driving transistor T4. Therefore, source voltage Vs=Vf−Vth can be acquired by a sensor in the pixel driving chip via transistor T3, from which the threshold voltage Vth is obtained. By changing Vf or Vi, different Vth values can be obtained at the conditions of different drain-source voltages Vds. This allows the effect of Vth be eliminated through voltage compensation by selecting a matching Vth value as a compensation voltage. Additionally, the effect of Vth at specific Vds can be eliminated to achieve even better compensation results. The Vi voltage is applied to the drain electrode of the driving transistor T4 which is coupled to a cathode of an OLED diode and is able to discharge the cathode voltage thereof.

In the P2 phase, EM1 and Gate1 signals are at low levels and signal S is at a high level. T1 and T5 are in conduction states, T2 and T3 are in blocking states. Power-supply voltage Vdd is applied at the same time to the gate electrode and source electrode of the driving transistor T4 to control it in a blocking state, thereby ending the process of acquiring values of threshold voltages Vth.

In the P3 phase, the pixel driving chip acquires the voltage drop at the source of the driving transistor T4. Signal Gate1 is at low level, signal S is at low level, and EM1 is at low level. T5 is in a conduction state to allow power-supply voltage Vdd to be written to the source electrode of the driving transistor T4. In the P3 phase, the pixel driving chip is able to read the source voltages for every pixel structure as T3 is in conduction state. By comparing the source voltage measured at the source electrode of T4 with a reference source voltage value, the voltage drop at the source relative to Vdd may be determined, as discussed hereinthroughout. Optionally, Vi is applied to the drain electrode of T4 for discharging OLED cathode voltage, leading to increased accuracy in measuring the voltage drop at the source electrode of T4.

In the P4 phase, the light-emitting device, or OLED, is operated normally for emitting light for image display. In the P4 phase, signal EM1 is at low level, signal S is at high level, signal Gate1 is at low level. The gate electrode of the driving transistor T4 is provided with a voltage Vg as Vdt=Vdt'+Vth−ΔVdd. The source voltage is provided with a voltage Vs=Vdd−ΔVdd. Therefore, the gate-source voltage Vgs of the driving transistor T4 becomes Vg-Vs=Vdt'+Vth−ΔVdd−(Vdd−ΔVdd)=Vdt'+Vth−Vdd. This leads to a drain current $I=K(Vgs-Vth)^2=K(Vdt'-Vdd)^2$, which is independent from both the threshold voltage Vth and the voltage drop ΔVdd. The OLED starts to emit light as the driving current passes through. A substantially uniform pixel intensity throughout the display apparatus may be achieved substantially unaffected by Vth drift or voltage drop variations.

Optionally, a capacitor C is included in the circuit to have its first terminal connected to the gate of the driving transistor T4 and a second terminal connected to the source of the driving transistor T4. There is no charging or discharging path for the capacitor. Whenever the gate electrode is floating, any change of the voltage at the source electrode will be reflected to the gate electrode, e.g., the Vgs will remain unchanged. Or when Vdd is changing during this phase, there is no path for discharging the capacitance C. As a result, the Vgs remains unchanged.

Figure 11:
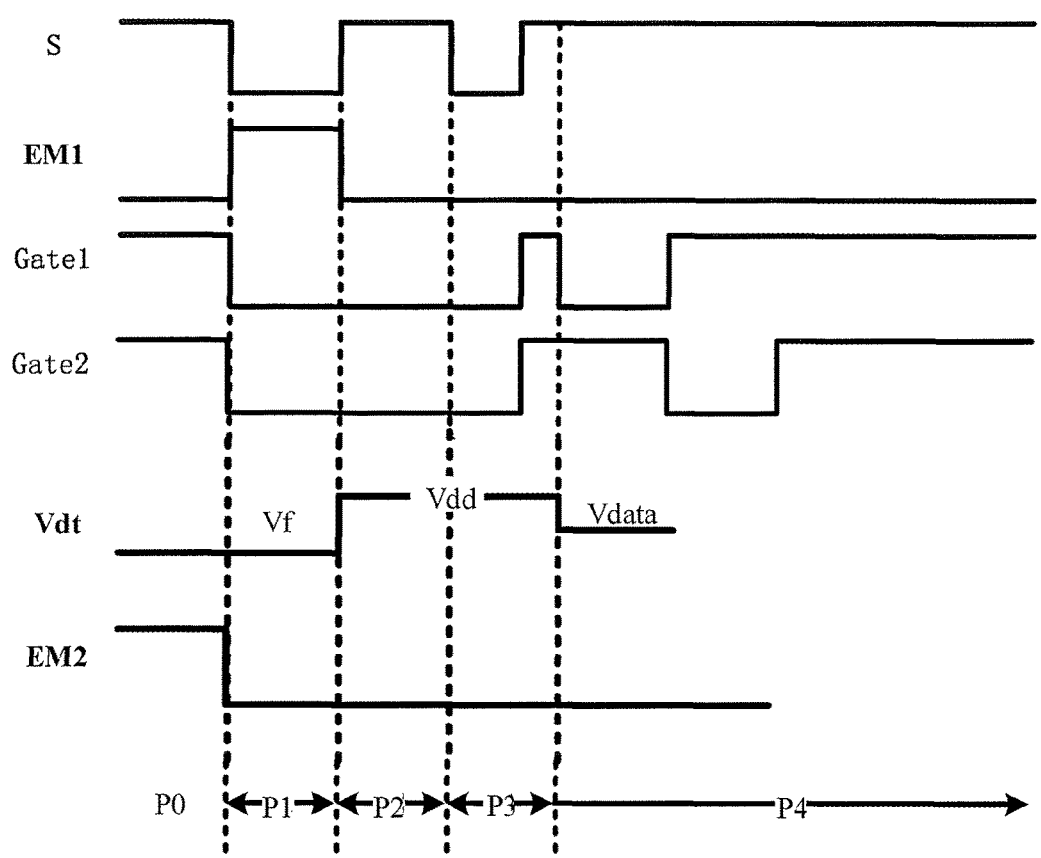
FIG. 11 is a simplified timing diagram for operating the pixel structure of FIG. 9 according to another embodiment of the present disclosure.

FIG. 11 is a simplified timing diagram for operating the pixel structure of FIG. 9 according to another embodiment of the present disclosure. Referring to FIG. 11, a shut-down operation can be applied to the first switching unit T1 prior to the start of the P4 phase, to eliminate effects of voltage compensation sampling process in the P3 phase on the normal display operartion in the P4 phase. As shown in FIG. 11, a short pulse of high level signal is inserted for signal Gate1 so that transistor T1 is turned off and only is turned on again by a low level scanning signal Gate1 when the normal image display phase P4 starts.

For most AMOLED-based display apparatus (containing a plurality of pixel structure and associated pixel driving chip according to the present disclosure), the source voltage of the driving transistor is uncertain during a first frame of image when the display apparatus is powering up. The uncertainty of the source voltage of the driving transistor may lead to unstable image display. In some embodiments, a fifth switching unit (e.g., a thin film transistor T6 of FIG. 9) may be added between the drain of the driving transistor and cathode of the OLED diode. A control signal EM2 is provided to the gate of T6. Prior to the P1 phase for acquiring measured source voltages, the signal EM2 is set at a high level in the P0 phase to turn off T6 and block the power supply from the light-emitting device. In P0 phase, EM1 is at a low level to allow power-supply voltage Vdd be applied to the source electrode of the driving transistor to ensure stability of the source voltage of the driving transistor. In later program phases (e.g., P2 and P3) and subsequent normal display phase (e.g. P4), the T6 is turned on by applying a low level EM2 signal. By having T6, the operation stability of pixel structure may be further enhanced.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A pixel driving chip for compensating an original signal provided to a pixel structure including a driving transistor having a drain electrode coupled to a light-emitting device, the pixel driving chip comprising:
   a control circuit configured to generate at least one control voltage signals for controlling the driving transistor;
   an acquisition circuit configured to acquire a measured source voltage at a source electrode of the driving transistor under control of the at least one control voltage signals;
   a computation circuit configured to compute a compensation voltage based on the measured source voltage;
   a storage circuit configured to store the compensation voltage;
   a compensation circuit configured to compensate the original signal provided to the driving transistor using the compensation voltage stored in the storage circuit to obtain a compensated signal; and
   an output circuit configured to output the compensated signal to the driving transistor for driving the light-emitting device.

2. The pixel driving chip of claim 1, wherein the original signal is one of a gate scanning signal provided to a gate electrode of the driving transistor and a data signal provided to the source electrode of the driving transistor.

3. The pixel driving chip of claim 1, further comprising:
   a trigger circuit configured to trigger operations of the acquisition circuit, the computation circuit, and the storage circuit during powering up of the pixel structure for image display; and
   a shutdown circuit configured to shut down the acquisition circuit, the computation circuit, and the storage circuit after the compensation voltage is computed and stored.

4. The pixel driving chip of claim 1, wherein the compensated signal is a compensated gate scanning signal, and the output circuit is configured to output the compensated gate scanning signal to a gate electrode of the driving transistor for image display; and
   the compensation voltage is a threshold voltage of the driving transistor, wherein the at least one control voltage signals comprises a first test signal V1 outputted to a gate electrode of the driving transistor to control the driving transistor to be in the conducting state and a second test signal V2 outputted to a drain electrode of the driving transistor to control the driving transistor, the threshold voltage being a difference between the measured source voltage and the first test signal V1.

5. The pixel driving chip of claim 4, wherein the control circuit is configured to generate the at least one control voltage signals multiple times, each time the at least one control voltage signals comprises a set of first test signal V1 and second test signal V2, thereby generating a plurality sets of first test signal V1 and second test signal V2 having different voltage values;

the storage circuit is configured to store a threshold voltage corresponding to each set of the plurality sets of control voltage signals for controlling the driving transistor; and the compensation circuit is configured to determine a matched set out of the plurality sets of first test signal V1 and second test signal V2 that matches with the original signal, and is configured to compensate the original signal using the threshold voltage corresponding to the matched set to obtain the compensated signal.

6. The pixel driving chip of claim 5, wherein the second test signal V2 of the matched set is one that is closest to a calculated drain voltage corresponding to the original signal, among a plurality of second test signals V2 of the plurality sets of first test signal V1 and second test signal V2.

7. The pixel driving chip of claim 1, wherein the compensated signal is a compensated data signal, and the output circuit is configured to output the compensated data signal to the source electrode of the driving transistor for image display; and the compensation voltage is a voltage drop at the source electrode of the driving transistor relative to a reference voltage Vdd, wherein the at least one control voltage signals comprises a third test signal V3 outputted to a gate electrode of the driving transistor to control the driving transistor to be in a blocking state and the reference voltage Vdd applied to the source of the driving transistor, the voltage drop being a difference between the measured source voltage of the driving transistor and a reference source voltage value.

8. The pixel driving chip of claim 7, wherein the reference source voltage value is one of a maximum value and a minimum value among all measured source voltages of all driving transistors in all pixel structures.

9. A display apparatus, comprising a pixel driving chip of claim 1; and a pixel structure comprising:

the light-emitting device;

the driving transistor having the drain electrode coupled to the light-emitting device; and a state-control unit configured to be coupled between the pixel driving chip and the driving transistor for controlling the driving transistor upon receiving the at least one control voltage signals from the pixel driving chip;

wherein the driving transistor is configured to receive the compensated signal for image display obtained by compensating the original signal with the compensation voltage; the compensation voltage is computed based on a measured source voltage acquired at a source electrode of the driving transistor under control of the at least one control voltage signals.

10. The display apparatus of claim 9, wherein the compensated signal is a compensated gate scanning signal, and the output circuit is configured to output the compensated gate scanning signal to a gate electrode of the driving transistor;

the compensation voltage is a threshold voltage of the driving transistor, wherein the at least one control voltage signals comprises a first test signal V1 and a second test signal V2; and the state-control unit comprises a first switching unit and a second switching unit, the first switching unit having a first terminal configured to be connected to the pixel driving chip for receiving the first test signal V1 and a second terminal connected to a gate of the driving transistor, the second switching unit having a first terminal configured to be connected to the pixel driving chip for receiving the second test signal V2 and a second terminal connected to a drain electrode of the driving transistor, each of the first switching unit and the second switching unit having a control terminal configured to be coupled to the pixel driving chip for switching on and off each of the first switching unit and the second switching unit, respectively, the threshold voltage of the driving transistor being a difference between the measured source voltage and the first test signal V1.

11. The display apparatus of claim 9, wherein the compensated signal is a compensated data signal, and the output circuit is configured to output the compensated data signal to the source electrode of the driving transistor;

the compensation voltage is a voltage drop at the source electrode of the driving transistor relative to a reference voltage Vdd, wherein the set of control voltage signals comprises a third test signal V3 and the reference voltage Vdd; and the state-control unit comprises a first switching unit and a third switching unit, the first switching unit having a first terminal configured to be connected to the pixel driving chip for receiving the third test signal V3 and a second terminal connected to a gate of the driving transistor, the third switching unit having a first terminal configured to be connected to the pixel driving chip for receiving the reference voltage Vdd and a second terminal connected to the source electrode of the driving transistor, each of the first switching unit and the third switching unit having a control terminal coupled to the pixel driving chip for switching on and off each of the first switching unit and the third switching unit, respectively.

12. The display apparatus of the claim 11, wherein the state control circuit further comprises a fourth switching unit, the fourth switching unit comprising a thin film transistor having a first terminal configured to be connected to the pixel driving chip for receiving a clearing voltage signal V4 for discharging cathode voltage of the light-emitting device and a second terminal connected to a drain electrode of the driving transistor, the fourth switching unit having a control terminal configured to be connected to the pixel driving chip for receiving a control signal for switching on and off the fourth switching unit.

13. The display apparatus of claim 12, wherein the pixel structure further comprises a fifth switching unit having a thin film transistor coupled between the drain of the driving transistor and a cathode of the light-emitting device, the thin film transistor of the fifth switching unit having a control terminal configured to be connected to the pixel driving chip for receiving a control signal, the control signal being configured to turn off the thin film transistor of the fifth switching unit before the set of voltage signals is outputted from the pixel driving chip to the driving transistor; and configured to turn on the thin film transistor of the fifth switching unit after the set of control voltage signals is outputted from the pixel driving chip to the driving transistor.

14. A method of driving a pixel structure including a driving transistor having a drain electrode coupled to a light-emitting device, comprising:

generating at least one control voltage signals to control the driving transistor;

acquiring a measured source voltage at a source electrode of the driving transistor under control of the at least one control voltage signals;

computing a compensation voltage based on the measured source voltage;

storing the compensation voltage;

compensating an original signal provided to the driving transistor using the compensation voltage to obtain a compensated signal; and outputting the compensated signal to the driving transistor.

15. The method of claim 14, further comprising:

triggering processes of acquiring the measured source voltage, computing the compensation voltage based on the measured source voltage, and storing the compensation voltage during powering up of the pixel structure for image display; and ending the processes of acquiring the measured source voltage, computing the compensation voltage based on the measured source voltage, and storing the compensation voltage after the compensation voltage is computed and stored.

16. The method of claim 14, wherein the compensated signal is a compensated gate scanning signal, and the output circuit is configured to output the compensated gate scanning signal to a gate electrode of the driving transistor for image display; and the compensation voltage is a threshold voltage of the driving transistor, wherein the at least one control voltage signals comprises a first test signal V1 outputted to a gate of the driving transistor to control the driving transistor to be in the conducting state and a second test signal V2 outputted to a drain electrode of the driving transistor to control the driving transistor, the threshold voltage being a difference between the measured source voltage and the first test signal V1.

17. The method of claim 16, wherein generating the at least one control voltage signals comprises generating the at least one control voltage signals multiple times, each time the at least one control voltage signals comprises a set of first test signal V1 and second test signal V2, thereby generating a plurality sets of first test signal V1 and second test signal V2 having different voltage values;

storing the compensation voltage comprises storing a threshold voltage value corresponding to each control voltage signals; and compensating the original signal comprises determining a matched set out of the plurality sets of first test signal V1 and second test signal V2 that matches with the original signal; and using the threshold voltage corresponding to the matched set to compensate the original signal to obtain the compensated signal.

18. The method of claim 17, wherein the second test signal V2 of the matched set is one that is closest to a calculated drain voltage corresponding to the original signal, among a plurality of second test signals V2 of the plurality sets of the first test signal V1 and the second test signal V2.

19. The method of claim 14, wherein the compensated signal is a compensated data signal, and the output circuit is configured to output the compensated data signal to the source electrode of the driving transistor for image display; and the compensation voltage is a voltage drop at the source electrode of the driving transistor relative to a reference voltage Vdd, wherein the at least one control voltage signal comprises a third test signal V3 outputted to a gate of the driving transistor to control the driving transistor to be in a blocking state and the reference voltage Vdd applied to the source of the driving transistor, the voltage drop being a difference between the measured source voltage of the driving transistor and a reference source voltage value.

20. The method of claim 19, wherein the reference source voltage value is one of a maximum value and a minimum value among all measured source voltages of all driving transistors in all pixel structures.

* * * * *